United States Patent
Ando et al.

(10) Patent No.: US 9,887,351 B1
(45) Date of Patent: Feb. 6, 2018

(54) MULTIVALENT OXIDE CAP FOR ANALOG SWITCHING RESISTIVE MEMORY

(71) Applicant: International Business Machines Corporation, Armonk, NY (US)

(72) Inventors: Takashi Ando, Tuckahoe, NY (US); Marwan H. Khater, Astoria, NY (US); Seyoung Kim, White Plains, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/282,202

(22) Filed: Sep. 30, 2016

(51) Int. Cl.
  *H01L 45/00* (2006.01)
  *H01L 21/02* (2006.01)

(52) U.S. Cl.
  CPC .......... *H01L 45/085* (2013.01); *H01L 45/146* (2013.01); *H01L 45/1608* (2013.01)

(58) Field of Classification Search
  CPC ....... H01L 45/14; H01L 45/147; H01L 45/16; H01L 45/1233; H01L 45/1273; H01L 45/146; H01L 45/04; H01L 45/08; H01L 27/2409; G11C 13/0007; G11C 2213/31
  See application file for complete search history.

(56) References Cited

U.S. PATENT DOCUMENTS

| | | | |
|---|---|---|---|
| 2011/0089393 A1* | 4/2011 | Chang | G11C 11/5685 257/4 |
| 2012/0104343 A1* | 5/2012 | Ramaswamy | H01L 45/04 257/3 |
| 2014/0145140 A1* | 5/2014 | Kim | H01L 45/06 257/4 |
| 2014/0353566 A1 | 12/2014 | Wang et al. | |
| 2016/0197271 A1 | 7/2016 | Gassilloud et al. | |

FOREIGN PATENT DOCUMENTS

| | | |
|---|---|---|
| CN | 101621114 A | 1/2010 |
| CN | 104752609 A | 7/2015 |
| CN | 104795492 A | 7/2015 |

OTHER PUBLICATIONS

Gokmen et al., "Acceleration of Deep Neural Network Training with Resistive Cross-Point Devices", arXiv preprint arXiv:1603.07341 (2016).

Yu et al., "A neuromorphic visual system using RRAM synaptic devices with Sub-pJ energy and tolerance to variability: Experimental characterization and large-scale modeling", Proc. IEEE IEDM, pp. 10-4-1 to 4 (2012). (Reference cited by inventors).

(Continued)

*Primary Examiner* — Caridad Everhart
(74) *Attorney, Agent, or Firm* — Vazken Alexanian; McGinn IP Law Group, PLLC

(57) ABSTRACT

A resistive random access memory (RRAM) includes a first electrode, a second electrode, a base oxide provided between the first electrode and the second electrode, and a multivalent oxide provided between the first electrode and the second electrode. The multivalent oxide switches between at least two oxidative states.

20 Claims, 11 Drawing Sheets

30

(56) References Cited

OTHER PUBLICATIONS

Kouda et al., "Charged defects reduction in gate insulator with multivalent materials", Proc. IEEE Symp. on VLSI Tech., pp. 200-201 (2009). (Reference cited by inventors).

Yu et al., An electronic synapse device based on metal oxide resistive switching memory for neuromorphic computation. IEEE Trans. on Elec. Dev., 58(8), pp. 2729-2737 (2011).

Merced-Grafals et al., "Repeatable, accurate, and high speed multi-level programming of memristor 1T1R arrays for power efficient analog computing applications", Nanotechnology, 27(36), 365202-1 to 365202-9 (2016).

Woo et al.,"Improved Synaptic Behavior under Identical Pulses using AlOx/HfO2 Bilayer RRAM Array for Neuromorphic Systems". IEEE Elec. Dev. Lett, 37(8), pp. 904-907 (2016).

Hsieh et al., "A sub-1-volt analog metal oxide memristive-based synaptic device for energy-efficient spike-based computing systems", arXiv preprint arXiv:1603.03979 (2016).

Park et al., "In situ observation of filamentary conducting channels in an asymmetric Ta2O5—x/TaO2—x bilayer structure", Nature communications, 4 pp. 2382-1 to 2382-9 (2013).

Seo et al., Analog memory and spike-timing-dependent plasticity characteristics of a nanoscale titanium oxide bilayer resistive switching device. Nanotechnology, 22(25), pp. 254023-1 to 254023-5 (2011).

Umezawa et al., "Effects of capping HfO2 with multivalent oxides toward reducing the number of charged defects", App.Phys. Lett., 96(16), 2906-1 to 2906-3 (2010).

Wang et al., "Engineering incremental resistive switching in TaO x based memristors for brain-inspired computing", Nanoscale 8, pp. 14015-14022 (2016).

\* cited by examiner

FIG. 9

| Top Electrode 32 | Base Oxide 56 | Multivalent Oxide 34 | Bottom Electrode 38 |

| Top Electrode 32 | Base Oxide 56 | Multivalent Oxide 34 | Base Oxide 56 | Bottom Electrode 38 |

MULTIVALENT OXIDE CAP FOR ANALOG SWITCHING RESISTIVE MEMORY

BACKGROUND OF THE INVENTION

Field of the Invention

The present invention relates generally to a method and apparatus for a resistive memory, and more particularly relates to a method, system, and apparatus for multivalent oxide cap for analog switching resistive memory.

Description of the Related Art

Resistive random access memory (RRAM) is considered as a promising technology for electronic synapse devices or memristor for neuromorphic computing as well as high-density and high-speed non-volatile memory application. In neuromorphic computing applications, a resistive memory device can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

Deep Neural Networks (DNNs) demonstrated significant commercial success in the last years with performance exceeding sophisticated prior methods in speech and object recognition. However, training the DNNs is an extremely computationally intensive task that requires massive computational resources and enormous training time that hinders their further application.

Recently, a device concept of Resistive Processing Unit (RPU) to further enhance the functionality of neuromorphic computing has been made. Analog-like switching (linear transition from minimum to maximum states (and vice versa) in 1000 steps) is required for RPU application. Oxide-based ReRAMs in general show gradual RESET and abrupt SET as a function of sweep voltages, which results in non-linear response to pulsed input on SET side. Previous methods of switching in resistive devices have not provided for performance necessary in large scale applications.

The current resistive devices have their difficulties, including non-linear response, slow resets, and improper setting of voltages. There is also a need to provide better performance of resistive devices.

SUMMARY OF INVENTION

In view of the foregoing and other problems, disadvantages, and drawbacks of the aforementioned background art, an exemplary aspect of the present invention provides a system, apparatus, and method of multivalent oxide cap for analog switching resistive memory.

One aspect of the present invention provides a resistive random access memory (RRAM) that includes a first electrode, a second electrode, a base oxide provided between the first electrode and the second electrode, and a multivalent oxide provided between the first electrode and the second electrode, wherein the multivalent oxide switches between at least two oxidative states.

Another aspect of the present invention provides resistive semiconductor device, including a first electrode, a base oxide formed above the first electrode, and a multivalent oxide formed above the first electrode, wherein the multivalent oxide switching between at least two oxidative states.

Yet another aspect of the present invention provides a method of forming a resistive random access memory (RRAM), the method including forming a first electrode, forming a second electrode, forming a base oxide provided between the first electrode and the second electrode, and forming a multivalent oxide provided between the first electrode and the second electrode, wherein the multivalent oxide switching between at least two oxidative states.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

FIG. 9 illustrates the RRAM structure in another exemplary embodiment.

FIG. 10 illustrates the RRAM structure in yet another exemplary embodiment.

DETAILED DESCRIPTION OF A PREFERRED EMBODIMENTS

Figure 1:
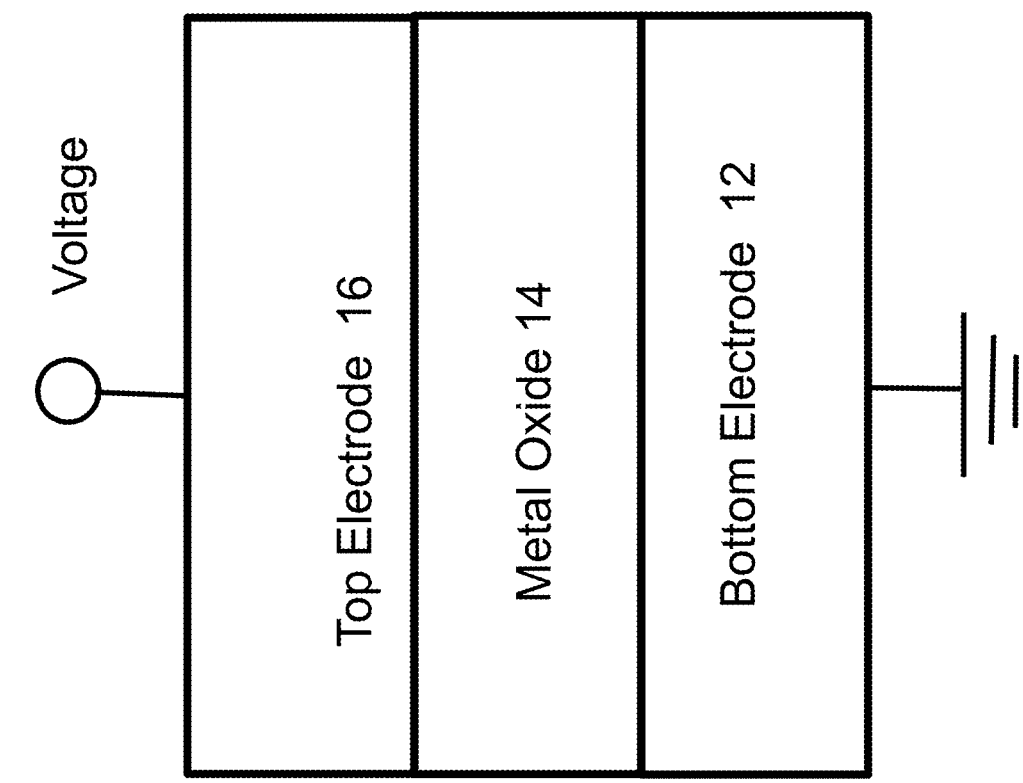
FIG. 1 illustrates an example RRAM structure.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

As mentioned, resistive random access memory (RRAM) is considered as a promising technology for electronic synapse devices or memristor for neuromorphic computing as well as high-density and high-speed non-volatile memory application.

Deep Neural Networks (DNNs) have implemented RRAMs. However, training DNNs is an extremely computationally intensive task that requires massive computational resources and enormous training time that hinders their further application. For example, a 70% relative improvement has been demonstrated for a DNN with 1 billion connections that was trained on a cluster with 1000 machines for three days. Training the DNNs relies in general on the backpropagation algorithm that is intrinsically local and parallel. Various hardware approaches to accelerate DNN training that are exploiting this locality and parallelism have been explored with a different level of success starting from the early 90s to current developments with GPU, FPGA or specially designed ASIC.

Further acceleration is possible by fully utilizing the locality and parallelism of the algorithm. For a fully connected DNN layer that maps neurons to neurons significant acceleration can be achieved by minimizing data movement using local storage and processing of the weight values on the same node and connecting nodes together into a massive systolic array where the whole DNN can fit in. Instead of a usual time complexity, the problem can be reduced therefore to a constant time independent of the array size. However, the addressable problem size is limited to the number of nodes in the array that is challenging to scale up to billions even with the most advanced CMOS technologies. Novel nano-electronic device concepts based on non-volatile memory (NVM) technologies, such as phase change memory (PCM) and resistive random access memory (RRAM), have been explored recently for implementing neural networks with a learning rule inspired by spike-timing-dependent plasticity (STDP) observed in biological systems.

Device characteristics usually considered beneficial or irrelevant for memory applications such as high on/off ratio, digital bit-wise storage, and asymmetrical set and reset operations, are becoming limitations for acceleration of DNN training. These non-ideal device characteristics can potentially be compensated with a proper design of peripheral circuits and a whole system, but only partially and with a cost of significantly increased operational time.

An example RRAM 10 is shown in FIG. 1. Resistive random-access memory (RRAM or ReRAM) is a type of non-volatile random-access (RAM) memory that works by changing the resistance across a dielectric solid-state material often referred to as a memristor.

The RRAM structure 10 can include a bottom electrode 12, with a metal oxide 14 formed on the bottom electrode 12. Additionally, there is a top electrode 16 formed on the metal oxide 14. A voltage is applied from the top electrode 16, with a ground at the bottom electrode 12.

In neuromorphic computing applications, a resistive memory device can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, and $TiO_x$, are integrated into nano-crossbar arrays and nano-cross-points scaled down to a feature size by electron beam lithography. This shows fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two stable states such as $TiO_2$ are integrated as two terminal memory devices to efficiently create a RRAM bit pattern.

These cells can be integrated into crossbar arrays where it reduces the cell size per bit to four. The switching material can cover the whole chip area and every junction at a cross point is an addressable cell of a RRAM. Since the array consists of passive elements, additional active external circuitry is required for the operation to address the cells, set, and reset their state and read the stored information.

Figure 2:
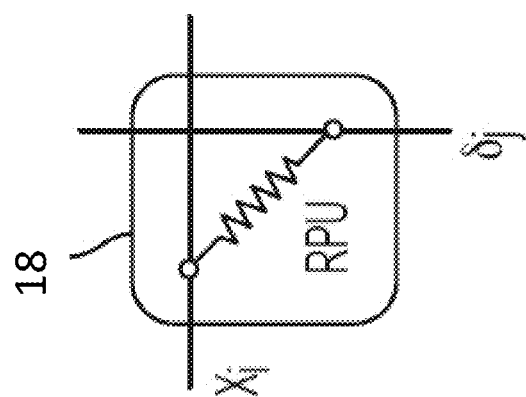
FIG. 2 illustrates an example RPU device.

Artificial neural networks (ANNs) can be formed from crossbar arrays of RPUs that provide local data storage and local data processing without the need for additional processing elements beyond the RPU. The trainable resistive crosspoint devices are referred to as resistive processing units (RPUs) 18 as seen for example in FIG. 2.

Figure 3:
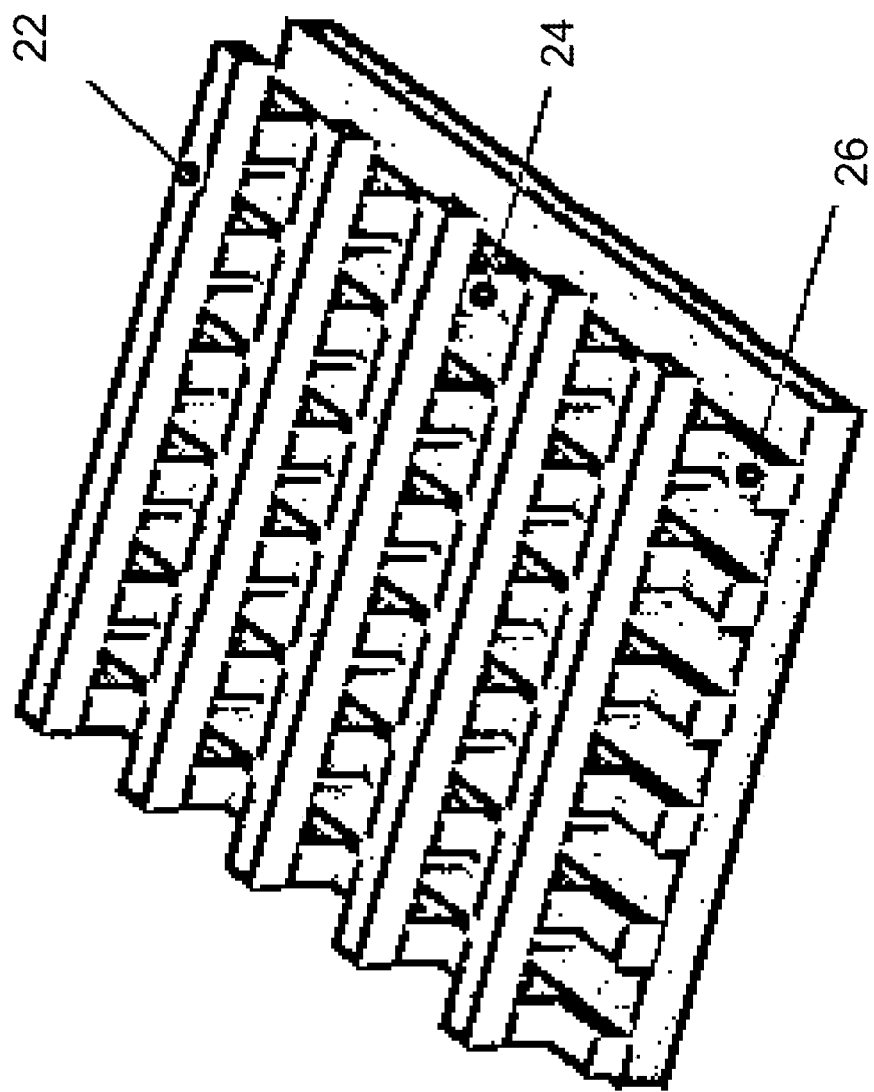
FIG. 3 is an example crossbar array of RRAM.

Referring to FIG. 3, the crossbar array of RRAM 20 is shown with junction with resistively switching material 24 formed on the bottom electrodes 26. The top electrodes 22 are formed on the junction with resistively switching material 24 to form a crossbar array of RRAMs 20.

The neurons are integrated in CMOS circuitry with cross bar array of devices, which stores a matrix. The input neurons, along with the hidden neuron layers and output neurons and input signals. The neurons states can be, for example, backward, forward and update.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The Resistive Processing Unit (RPU) can further enhance the functionality of neuromorphic computing. The new class of devices (RPU) that can be used as processing units to accelerate various algorithms including neural network training.

In the oxide-based ReRAM, there are many challenges for Resistive Processing Units. Oxide based ReRAM including, for example, TiO/HfO laminate, TaO, and AlO/HfO. Oxide-based ReRAMs in general show gradual RESET and abrupt SET as a function of sweep voltages for changing the resistive states. The positive bias side can be more abrupt, while the negative bias side is more gradual. Such issues results in non-linear response to pulsed input on SET side. It is preferable that the current to voltage graph be more gradual for the switching. SET is the bias polarity of positive in this case. When the current is changed, the voltage change is very abrupt, which is not preferred. The present invention slows down this process.

Multivalent oxide (e.g. CeOx, EuOx, PrOx) caps on High-k are predicted to modify oxygen chemical potential via oxidation ($Ce_2O_3 \rightarrow CeO_2$) and reduction ($CeO_2 \rightarrow Ce_2O_3$). The CeOx cap on $HfO_2$ is expected to retard Vo formation.

Figure 4:
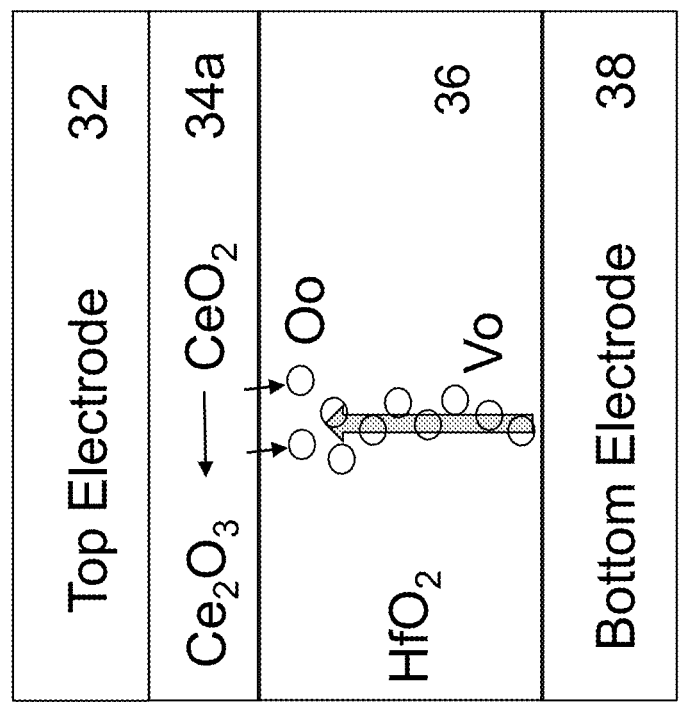
FIG. 4 illustrates a first state of a RRAM structure of an exemplary embodiment.
Figure 5:
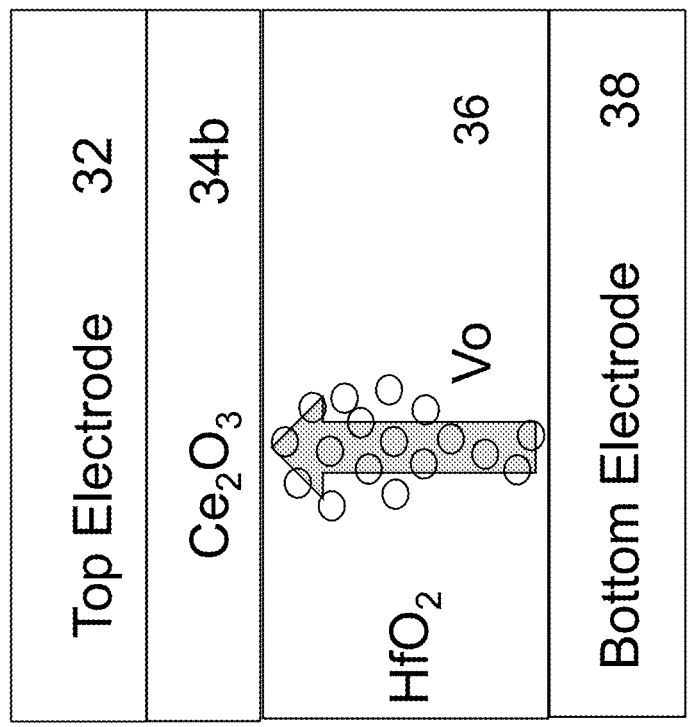
FIG. 5 illustrates a second state of a RRAM structure of the exemplary embodiment.
Figure 6:
FIG. 6 illustrates the RRAM stack in the exemplary embodiment.

Referring to FIGS. 4 through 6, the multivalent oxides switches the oxidative states from $CeO_2$ 34a changes to Ce$_2$O$_3$ 34b in a RRAM structure 30 in an exemplary embodiment. When the switching happens in the RRAM structure 30, the multivalent oxide 34 is originally CeO$_2$ 34a, and the Oxygen vacancy (Vo) in the HfO$_2$ layer 36 becomes a filament and it becomes a conductive path. The formation of such a filament is very abrupt. However, if there is multivalent oxide CeO$_2$, the CeO$_2$ can provide an Oxygen to HfO$_2$ to mitigate the vacancy formation. As seen in FIG. 5, the multivalent oxide layer 34 switches states to Ce$_2$O$_3$ 34b. Therefore, this change in the multivalent oxide layer 34 and HfO$_2$ 36 layer slows down the process. During the different cycles of switching the oxidative state of CeO$_2$ is different. Ce$_2$O$_3$ 34b is provided at the low resistance state. Then if multivalent oxide layer 34 goes to the high resistance state, then it goes back to CeO$_2$ 34a.

Therefore, during the switching cycle of RRAM 30, the oxidative state of multivalent oxide 34 is varying.

Referring to FIG. 6, in summary a RRAM structure 30 is provided with the HfO$_x$ layer 36 provided on the bottom electrode 38. The multivalent oxide layer 34 is provided on the HfO$_x$ layer 36. The top electrode 32 is formed on the Multivalent Oxide layer 34. The Multivalent Oxide layer 34 can be, for example, CeO$_x$, PrO$_x$, EuO$_x$, VO$_x$, or other multivalent oxide that cap the base oxide of HfO$_x$ 36.

Therefore, in the present invention, there is provided Metal-insulator-Metal stack, where, for example, HfO$_x$ or TaO$_x$ can be used as base oxides 36. Moreover, multivalent oxides 34, such as CeO$_x$, PrO$_x$, EuO$_x$, VO$_x$, can be used as a capping layer on the base oxide 36. Any oxide that has at least two oxidative states can be used.

In this embodiment, the HfO$_x$ 36 is top capped, but in another embodiment there can be multivalent oxide under the HfO$_x$, in the middle of the HfO$_x$ and in doped case where the multivalent oxide is doped into the HfO$_x$ as shown in the following embodiments.

Figure 7:
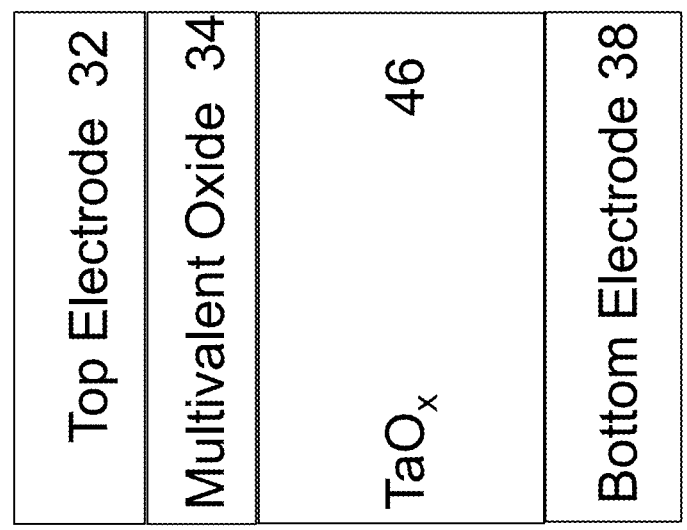
FIG. 7 illustrates the RRAM structure in another exemplary embodiment.

Referring to FIG. 7, a RRAM structure 40 of another exemplary embodiment is provided. In the RRAM structure 40, there is the TaO$_x$ layer 46 provided on the bottom electrode 38. The multivalent oxide layer 34 is provided on the TaO$_x$ layer 46. The top electrode 32 is formed on the Multivalent Oxide layer 34. The Multivalent Oxide layer 34 as mentioned above, can be, for example, CeO$_x$, PrO$_x$, EuO$_x$, VO$_x$, or other multivalent oxide that cap the base oxide of TaO$_x$ layer 46. The multivalent oxide layer 34 switches oxidative states from, for example, CeO$_2$ to Ce$_2$O$_3$ as shown above in FIGS. 4 through 6.

Figure 8:
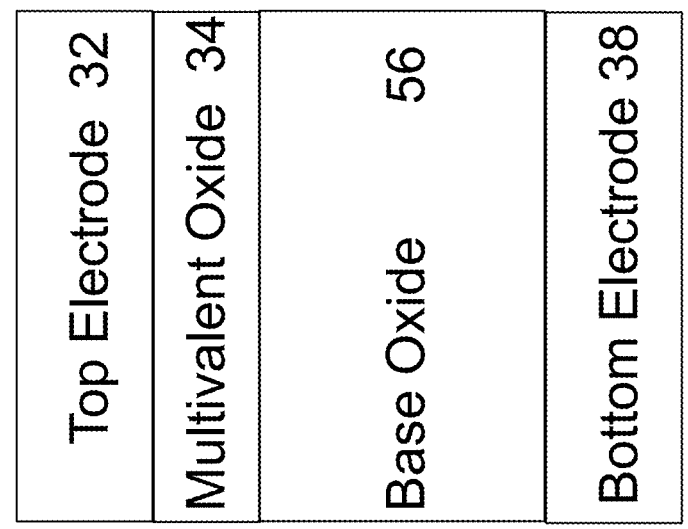
FIG. 8 illustrates the RRAM structure in yet another exemplary embodiment.

Referring to FIG. 8, a RRAM structure 50 of another exemplary embodiment is provided. In the RRAM structure 50, there is the base oxide layer 56 provided on the bottom electrode 38. The multivalent oxide layer 34 is provided on the base oxide layer 56. The top electrode 32 is formed on the Multivalent Oxide layer 34. The Multivalent Oxide layer 34 as mentioned above, can be, for example, CeO$_x$, PrO$_x$, EuO$_x$, VO$_x$, or other multivalent oxide that cap the base oxide layer 56. The multivalent oxide layer 34 switches at least two oxidative states during a switching cycle as shown above. The base oxide 56 can be any one of HfO$_x$, TaO$_x$, or other similar base oxide.

Referring to FIG. 9, a RRAM structure 60 of another exemplary embodiment is provided with the multivalent oxide 34 below the base oxide layer 56. In the RRAM structure 60, there is the multivalent oxide layer 34 provided on the bottom electrode 38. The multivalent oxide layer 34 is provided below the base oxide layer 56. Other types of layers can be formed there between any of the layers shown. The top electrode 32 is formed on the base oxide layer 56. The multivalent Oxide layer 34 as mentioned above, can be, for example, CeO$_x$, PrO$_x$, EuO$_x$, VO$_x$, or other multivalent oxide that cap the base oxide layer 56. The multivalent oxide layer 34 switches among at least two oxidative states during a switching cycle of the RRAM structure 60. The base oxide 56 can be any one of HfO$_x$, TaO$_x$, or other similar base oxide.

Referring to FIG. 10, an RRAM structure 70 of another exemplary embodiment is provided with the multivalent oxide 34 between the base oxide layer 56. In the RRAM structure 60, there is the base oxide layer 56 provided on the bottom electrode 38. The multivalent oxide layer 34 is provided between the base oxide layer 56 as shown in the example. Other types of layers can be formed there between any of the layers shown. The top electrode 32 is formed on the base oxide layer 56. As mentioned above, the multivalent oxide layer 34 switches among at least two oxidative states during a switching cycle of the RRAM structure 70. Other configurations and order of the multivalent oxide 34 and base oxide 56 are possible.

Figure 11:
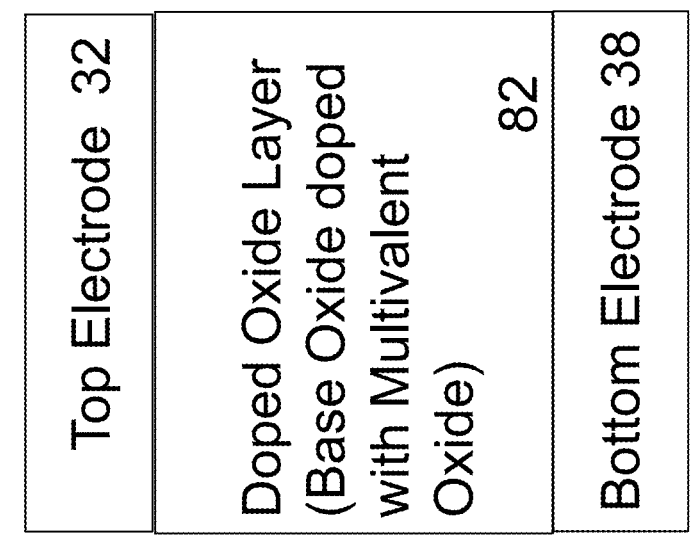
FIG. 11 illustrates the RRAM structure in another exemplary embodiment.

Referring to FIG. 11, a RRAM structure 80 of another exemplary embodiment is provided with a doped oxide layer 82, where a base oxide is doped with a multivalent oxide. In the RRAM structure 60, there is the doped oxide layer 82 provided on the bottom electrode 38. The top electrode 32 is formed on the doped oxide layer 82. Other types of layers can be formed there between any of the layers shown.

The doped oxide layer 82 can include a base oxide layer doped with a multivalent oxide. The multivalent oxide can be, for example, CeO$_x$, PrO$_x$, EuO$_x$, VO$_x$, or other multivalent oxide. The base oxide that is doped in doped oxide layer 82 can be, for example, any one of HfO$_x$, TaO$_x$, or other similar oxide. The doped oxide layer 82 includes the multivalent oxide switching among at least two oxidative states during a switching cycle of the RRAM structure 80.

Therefore, during the resistance switching cycle of RRAM of all the embodiments shown above, the oxidative state of multivalent oxide 34 is varying.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

What is claimed is:

1. A resistive random access memory (RRAM), comprising:
   a first electrode;
   a second electrode;
   a base oxide provided between the first electrode and the second electrode; and
   a multivalent oxide provided between the first electrode and the second electrode,
   wherein the multivalent oxide switches between at least two oxidative states, and
   wherein the base oxide is doped or stacked with the multivalent oxide.

2. The resistive random access memory according to claim 1, wherein the oxidative states of multivalent oxide is varying during a resistance switching cycle.

3. The resistive random access memory according to claim 1, wherein the multivalent oxide comprises at least one of $CeO_x$, $PrO_x$, $EuO_x$, and $VO_x$.

4. The resistive random access memory according to claim 1, wherein the base oxide comprises at least one of $HfO_x$ and $TaO_x$.

5. The resistive random access memory according to claim 1,
   wherein the base oxide is provided on the first electrode, and
   wherein the multivalent oxide is provided on the base oxide.

6. The resistive random access memory according to claim 1,
   wherein the multivalent oxide is provided on the first electrode, and
   wherein the base oxide is provided on the multivalent oxide.

7. The resistive random access memory according to claim 1,
   wherein the multivalent oxide is provided between the base oxide and the first electrode,
   wherein the base oxide is provided on the first electrode, and
   wherein the second electrode is provided on the base oxide.

8. The resistive random access memory according to claim 1,
   wherein the base oxide is doped with the multivalent oxide to form a doped oxide layer,
   wherein the doped oxide layer is provided on the first electrode,
   wherein the second electrode is provided on the doped oxide layer, and
   wherein the base oxide is not a metal-insulator transition material.

9. A resistive semiconductor device, comprising:
   a first electrode;
   a base oxide formed above the first electrode; and
   a multivalent oxide formed above the first electrode,
   wherein the multivalent oxide switches between at least two oxidative states, and
   wherein the base oxide is doped or stacked with the multivalent oxide.

10. The resistive semiconductor device according to claim 9, further comprising:
    a second electrode formed on the base oxide and the multivalent oxide and above the first electrode.

11. The resistive semiconductor device according to claim 9, wherein the oxidative states of multivalent oxide is varying during a resistance switching cycle.

12. The resistive semiconductor device according to claim 9, wherein the multivalent oxide comprises at least one of $CeO_x$, $PrO_x$, $EuO_x$, and $VO_x$.

13. The resistive semiconductor device according to claim 9, wherein the base oxide comprises at least one of $HfO_x$ and $TaO_x$.

14. The resistive semiconductor device according to claim 9,
    wherein the base oxide is provided on the first electrode, and
    wherein the multivalent oxide is provided on the base oxide.

15. The resistive semiconductor device according to claim 9,
    wherein the multivalent oxide is provided on the first electrode, and
    wherein the base oxide is provided on the multivalent oxide.

16. The resistive semiconductor device according to claim 9,
    wherein the multivalent oxide is provided between the base oxide and the first electrode,
    wherein the base oxide is provided on the first electrode, and
    wherein the second electrode is provided on the base oxide.

17. The resistive semiconductor device according to claim 9,
    wherein the base oxide is doped with the multivalent oxide to form a doped oxide layer,
    wherein the doped oxide layer is provided on the first electrode, and
    wherein the second electrode is provided on the doped oxide layer.

18. A method of forming a resistive random access memory (RRAM), the method comprising:
    forming a first electrode;
    forming a second electrode;
    forming a base oxide between the first electrode and the second electrode; and
    forming a multivalent oxide between the first electrode and the second electrode,
    wherein the multivalent oxide switches between at least two oxidative states, and
    wherein the base oxide is doped or stacked with the multivalent oxide.

19. The method according to claim 18, wherein the oxidative states of multivalent oxide is varying during a resistance switching cycle.

20. The method according to claim 18,
    wherein the multivalent oxide comprises at least one of $CeO_x$, $PrO_x$, $EuO_x$, and $VO_x$, and
    wherein the base oxide comprises at least one of $HfO_x$ and $TaO_x$.

* * * * *